US006853245B2

(12) United States Patent
Kim et al.

(10) Patent No.: US 6,853,245 B2
(45) Date of Patent: Feb. 8, 2005

(54) DOHERTY AMPLIFIER

(75) Inventors: Bumman Kim, Pohang (KR); Youngoo Yang, Pohang (KR); Jeonghyeon Cha, Pohang (KR)

(73) Assignee: Pohang University of Science & Technology Foundation, Kyungsangbuk-do (KR)

( * ) Notice: Subject to any disclaimer, the term of this patent is extended or adjusted under 35 U.S.C. 154(b) by 0 days.

(21) Appl. No.: 10/445,042

(22) Filed: May 27, 2003

(65) Prior Publication Data

US 2004/0041627 A1 Mar. 4, 2004

(30) Foreign Application Priority Data

Aug. 29, 2002 (KR) ................................. 10-2002-0051501

(51) Int. Cl.[7] ................................................ H03F 3/68
(52) U.S. Cl. ................................... 330/124 R; 330/295
(58) Field of Search ........................ 330/124 R, 295, 330/302

(56) References Cited

U.S. PATENT DOCUMENTS 5,012,200 A    4/1991   Meinzer
5,025,225 A    6/1991   Takima et al.
5,757,229 A    5/1998   Mitzlaff
5,786,727 A    7/1998   Sigmon
6,097,252 A    8/2000   Sigmon et al.
6,262,629 B1   7/2001   Stengel et al.
6,356,149 B1 * 3/2002   Stengel et al. .............. 330/107
6,472,934 B1 * 10/2002  Pehlke ........................ 330/10
6,639,464 B2 * 10/2003  Hellberg .................. 330/124 R

FOREIGN PATENT DOCUMENTS

EP              0 630 104 A2    12/1994

* cited by examiner

Primary Examiner—Henry Choe
(74) Attorney, Agent, or Firm—Leydig, Voit & Mayer, Ltd.

(57) ABSTRACT

A microwave Doherty amplifier employs a way-extension in which N ways (N≧2, N is a natural number) are established, and envelope tracking for high efficiency and linearity of the power amplifier of a mobile communications base station or of a handset with improved reliability. The Doherty amplifier includes N ways, where N≧2 and N is a natural number; a carrier amplifier which is placed on one of the N ways; peak amplifiers which are placed on respective ways of the (N−1) ways excluding the way on which the carrier amplifier is placed; a power distribution unit which distributes power to each of the N ways; and a quarter wave impedance transformer at which the N ways meet.

5 Claims, 6 Drawing Sheets

DOHERTY AMPLIFIER

BACKGROUND OF THE INVENTION

1. Field of the Invention

The present invention relates to a so-called microwave Doherty amplifier, and more particularly, to a microwave Doherty amplifier which employs a way-extension method by which N ways (N≧2, N is a natural number) are established, and an envelope tracking method so that high efficiency and linearity of the power amplifier of a mobile communications base station or a handset can be achieved and price competitiveness and reliability of an apparatus employing the Doherty amplifier can be improved.

2. Description of the Related Art

As is well-known to those skilled in the art, a Doherty amplifier is a type of amplifier used in high efficiency modulation of a power transmitter, and improves efficiency by combining a class B amplifier, a class C amplifier, and an impedance inverse circuit. The Doherty amplifier employs a method connecting a carrier amplifier and a peak amplifier (or a peaking amplifier) in parallel using a quarter wave transformer (λ/4 line).

The peak amplifier (or peaking amplifier) of the Doherty amplifier controls the load impedance of the carrier amplifier by changing the amount of current provided to a load according to a power level so that efficiency improves.

The microwave Doherty amplifier was introduced by W. H. Doherty in 1936, and, in its initial stages, was used in an amplitude modulation (AM) transmitter of a broadcasting apparatus using a long frequency (LF) vacuum tube and a medium frequency (MF) vacuum tube.

Since the microwave Doherty amplifier was first applied to and used in an AM transmitter, a variety of suggestions for using the microwave Doherty amplifier in solid-state high output power transmitter have been made and many actual implementations have been proposed. One of the implementations is shown in FIG. 1, in which impedance is transformed by using quarter wave transformers 6 and 8 having characteristic impedances (Zm, Zb). In this circuit, only resistive matching by a matching unit 4 is possible. Reference number 2 indicates a splitter for distribution of the input. Za is a characteristic impedance of the line provided so that the two outputs of the splitter 2 have a phase difference of 90°.

The circuit shown in FIG. 2 is another embodiment of the prior art in which the microwave Doherty amplifier is applied to a solid-state high output power transmitter. By placing matching circuits 24 and 34 at the output parts of transistors (Q1, Q2) and placing offset lines 26 and 36 in latter parts of the matching circuits 24 and 34, this circuit enables matching of the imaginary part as well as the real part of the impedances so that the output power of the amplifier is maximized and Doherty operation is performed. Reference number 2' indicates a splitter, reference number 20 indicates a carrier amplifying unit, reference number 30 indicates a peak amplifying unit, and Z1, Z2, and Z3 are characteristic impedances, respectively, of lines having the phase angles shown in FIG. 2.

However, though the Doherty amplifier increases efficiency when used in a high output power amplifier, it is insufficient to the improvement of linearity, which is needed for high capability and functionality of an apparatus.

SUMMARY OF THE INVENTION

To solve the above problems, it is an objective of the present invention to provide a Doherty amplifier which employs a way-extension method by which N ways (N≧2, N is a natural number) are established, and an envelope tracking method so that when the Doherty amplifier is applied to the power amplifier of a mobile communications base station or a handset, high efficiency and linearity can be simultaneously achieved and price competitiveness and reliability of an apparatus employing the Doherty amplifier can be improved.

To solve the above problems, it is another objective of the present invention to provide a Doherty amplifier which, in order to obtain improved efficiency characteristics in all types of Doherty amplifiers, extracts a predetermined input envelope signal, appropriately shapes the signal, and provides the signal to the gate bias of a peak amplifier.

According to an aspect of the present invention, there is provided a Doherty amplifier which comprises a predetermined carrier amplifier and a peak amplifier, the Doherty amplifier contains N ways, where N≧2 and N is a natural number; a carrier amplifier which is placed on one way of the N ways; peak amplifiers which are placed on respective ways of the (N−1) ways other than the way on which the carrier amplifier is placed; a power distribution unit which distributes power to each of the N ways; and a quarter wave impedance transformer at which the N ways meet.

It is preferable that the carrier amplifier and peak amplifiers are formed using identical transistors.

It is preferable that the characteristic impedance ($R_T$) of the quarter wave impedance transformer is:

$$R_T = \sqrt{\frac{R_{OP} R_{OC}}{R_{OP}} R_O}$$

where $R_O$ is an output load resistance at the back of the $R_T$, $R_{OC}$ is a characteristic impedance of an offset line located at the back of the carrier amplifier and $R_{OP}$ is a characteristic impedance of an offset line located at the back of the peak amplifier.

It is preferable that the characteristic impedance of the offset line located at the back of the carrier amplifier has a predetermined angle of $\theta_C$, the characteristic impedance of the offset line located at the back of the peak amplifier has a predetermined angle of $\theta_P$ and a transmission line having a predetermined angle of $90° + \theta_C - \theta_P$ is placed in front of each of the peak amplifiers.

It is preferable that the Doherty amplifier further comprises an envelope tracking unit which turns off the peak amplifier in a low power range and gradually, turns on the peak amplifier to the level of the carrier amplifier bias in a high power range, in order to use the characteristic of the Doherty amplifier which makes the gate bias of the carrier amplifier different from the gate bias of the peak amplifier.

It is preferable that the envelope tracking unit, comprises an envelope detector; and an envelope shaping circuit which attenuates and/or amplifies an envelope signal detected by the envelope detector, removes an offset, and provides the signal as the gate voltage of the peak amplifier.

BRIEF DESCRIPTION OF THE DRAWINGS

The above objects and advantages of the present invention will become more apparent by describing in detail the preferred embodiments thereof with reference to the attached drawings in which:

FIG. 6b is a graph of a transfer curve of a signal passing the envelope shaping circuit of FIG. 6a;

DESCRIPTION OF THE PREFERRED EMBODIMENTS

Figure 1:
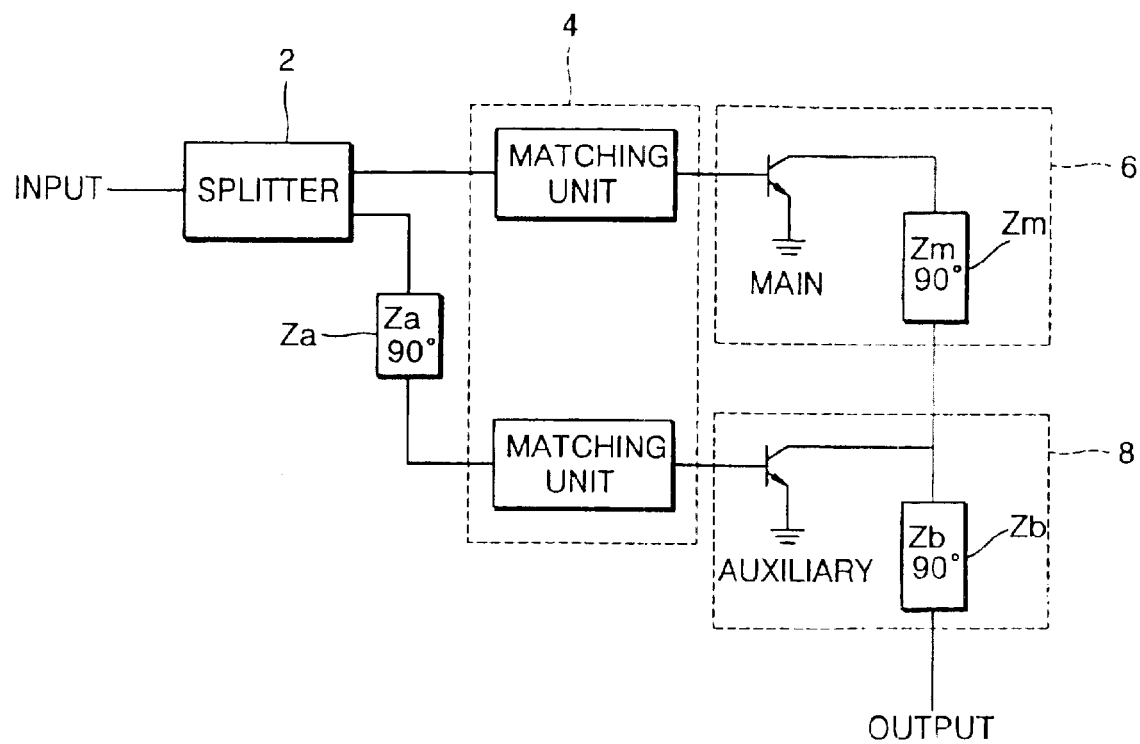
FIG. 1 is a diagram of the structure of an embodiment of a microwave Doherty amplifier according to the prior art.
Figure 2:
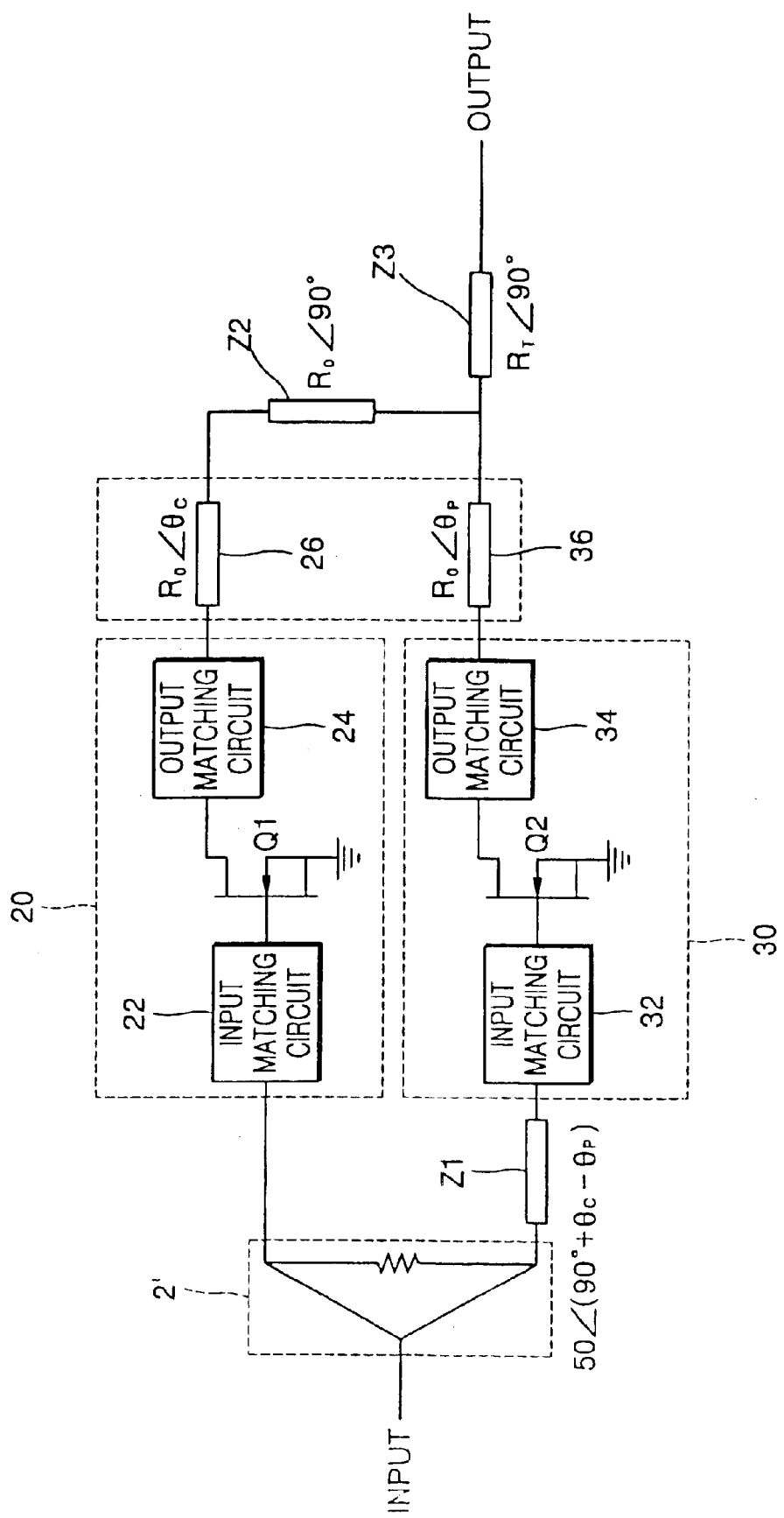
FIG. 2 is a diagram of the structure of another embodiment of a microwave Doherty amplifier according to the prior art.
Figure 3:
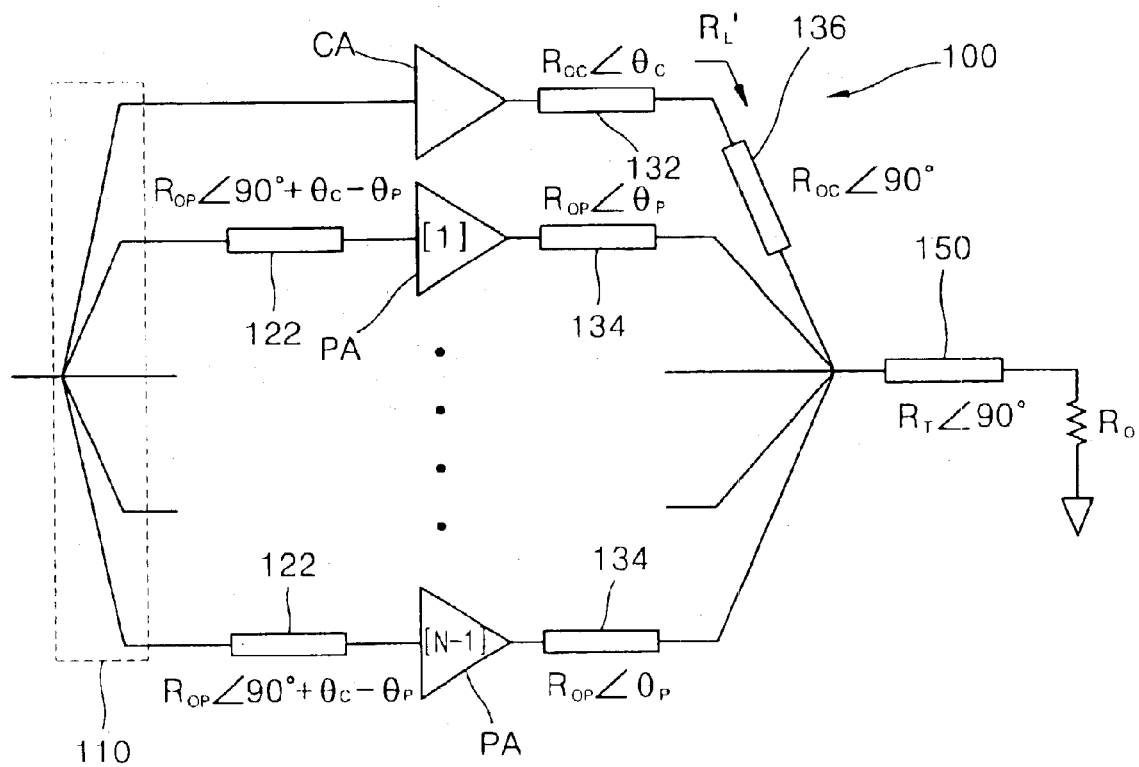
FIG. 3 is a diagram of the structure of a microwave Doherty amplifier according to a preferred embodiment of the present invention.

FIG. 3 shows a microwave Doherty amplifier (N-way Doherty amplifier) 100 according to the present invention, which is extended to have N ways (N≧2, N is a natural number). The Doherty amplifier 100 according to the present invention includes a carrier amplifier (CA) located at the top and N-1 peak amplifiers (PA) located under the carrier amplifier (CA). Therefore, the Doherty amplifier according to the present invention has N ways in total and has a splitter 110 which distributes appropriated power to each of the ways. The splitter 110 is placed at the front of the N-ways as shown in FIG. 3. The carrier amplifier (CA) and peak amplifiers (PA[1] through PA[N-1]) can be implemented using identical transistors. When identical transistors are used to implement the carrier amplifier (CA) and peak amplifiers (PA), respective characteristic impedances can be determined such that perfect power combining can be achieved. For this, in the Doherty amplifier 100 of the present invention, a quarter wave impedance transformer 150 located in front of an output load resistance ($R_O$) has the same impedance ($R_T$) as presented in expression 1:

$$R_T = \sqrt{\frac{R_{OP} R_{OC}}{R_{OP}}} R_O \quad (1)$$

where $R_{OC}$ is a characteristic impedance of an offset line 132 located at the back of the carrier amplifier (CA) and $R_{OP}$ is a characteristic impedance of an offset line 134 located at the back of the peak amplifier (PA).

Meanwhile, in the Doherty amplifier 100 of the present invention, the offset line 132 located at the output end of the carrier amplifier (CA) has an angle of $\theta_C$ and the offset lines 134 located at the output end of the peak amplifier (PA) has an angle of $\theta_P$, as shown in FIG. 3. In order to compensate for the effect of the quarter-wave transmission line 136 at the end of the carrier amplifier for Doherty operation and the offset lines 132 and 134, a transmission line 122 having a predetermined angle of $90°+\theta_C-\theta_P$ is placed at the input end of each peak amplifier (PA).

Figure 4:
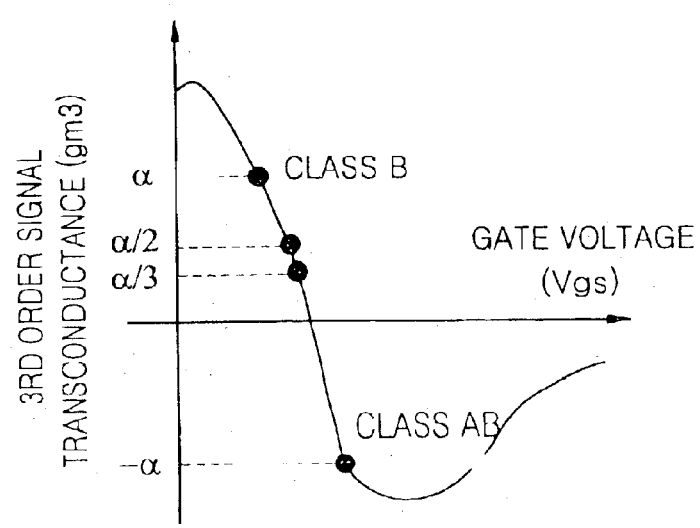
FIG. 4 is a graph explaining the linearization of the Doherty amplifier of FIG. 3.

FIG. 4 is a graph explaining the linearization principle of the Doherty amplifier according to the present invention. FIG. 4 shows the third order large signal transconductance (gm3) versus the gate voltage. Transconductance has a nonlinear characteristic and this can be expanded with a number of terms, in which the number of terms is determined according to the size of a signal. It is well-known that at this time, a first order term is a component for normal amplification, and an n-th order term is a component for generating an n-th order harmonic wave. In the case of a ordinary field effect transistor (FET), the third order large signal transconductance (gm3) is transited from a positive value to a negative value according to the gate voltage (Vgs). In the case of an ordinary normal class AB bias (-α location of FIG. 5), the third transconductance (gm3) is negative, and in an appropriate location near class B, a location having a value α can be found. Therefore, if two amplifiers combined in parallel have different biases, third order intermodulation (IM3) components having phases opposite to each other are generated and a cancellation effect is eventually obtained in the final output. Here, in the case of a Doherty amplifier having N ways, if the carrier amplifier is biased at -α location and the bias of (N-1) peak amplifiers (PA) is adjusted with α/(N-1), the order intermodulation (IM3) component, which is a third harmonic wave generated by non-linearity, can be accurately canceled. Generally, in the case of a Doherty amplifier wherein N=2, in order to completely cancel the IM3 component, the peak amplifier should be biased at α. However, at this time, bias of the peak amplifier is too low such that fifth or higher order intermodulation distortion occurs largely. That is, obtaining optimal linearity improvement may cause a large high order intermodulation distortion. Therefore, as in the present invention, the occurrence of high order intermodulation distortion in obtaining optimal linearity improvement should be prevented. Accordingly, there is a need for extension of ways (N≧3), and as increasing the number of peak amplifiers (PA), cancellation of the third order intermodulation component is enabled in conditions of relatively high bias.

Figure 5:
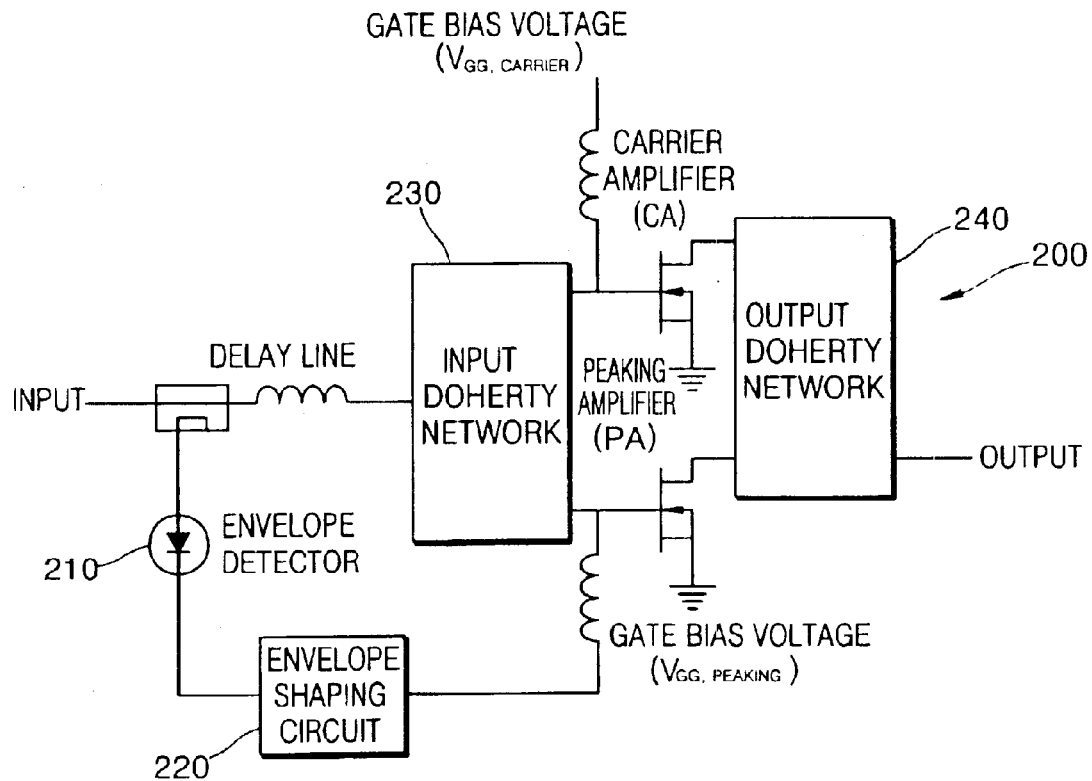
FIG. 5 is a diagram of the structure of the Doherty amplifier employing an envelope tracking apparatus according to the present invention.

FIG. 5 is a diagram of the structure of the Doherty amplifier employing an envelope tracking apparatus 200 according to the present invention. The major characteristic of the envelope tracking apparatus 200 according to the present invention is use of the characteristic of a Doherty amplifier to make the gate bias voltage of the carrier amplifier (CA) and the gate bias voltage of the peak amplifier (PA) different. The envelope tracking apparatus 200 of the present invention, uses an envelope tracking method for adjusting the peak amplifier (PA), by which the peak amplifier (PA) is turned off in a low power range, and in a high power range, is gradually turned on to the level of the gates bias voltage ($V_{GG, Carrier}$) of the carrier amplifier (CA). By doing so, the envelope tracking apparatus 200 according to the present invention makes appropriate for amplification of a modulated signal, which envelope changes with respect to time, and prevents in advance gain decrease, output power decrease, and degradation of linearity that may occur by fixing the gate bias voltage ($V_{GG, Peaking}$) of the carrier amplifier (CA) to a low value. It is clear to those skilled in the art that the Doherty amplifier having N ways as shown in FIG. 3, as well as all existing Doherty amplifiers, can be applied to the envelope tracking apparatus 200 according to the present invention.

Reference number 210 in FIG. 5 indicates an envelope detector for detecting an envelope, and 220 indicates an envelope shaping circuit for appropriately transforming an envelope, signal detected by the envelope detector 210. Reference number 230 indicates an input Doherty network, reference number 240 indicates an output Doherty network, and a carrier amplifier (CA) and a peak amplifier (PA) are located between the input Doherty network 230 and the output Doherty network 240.

Figure 6A:
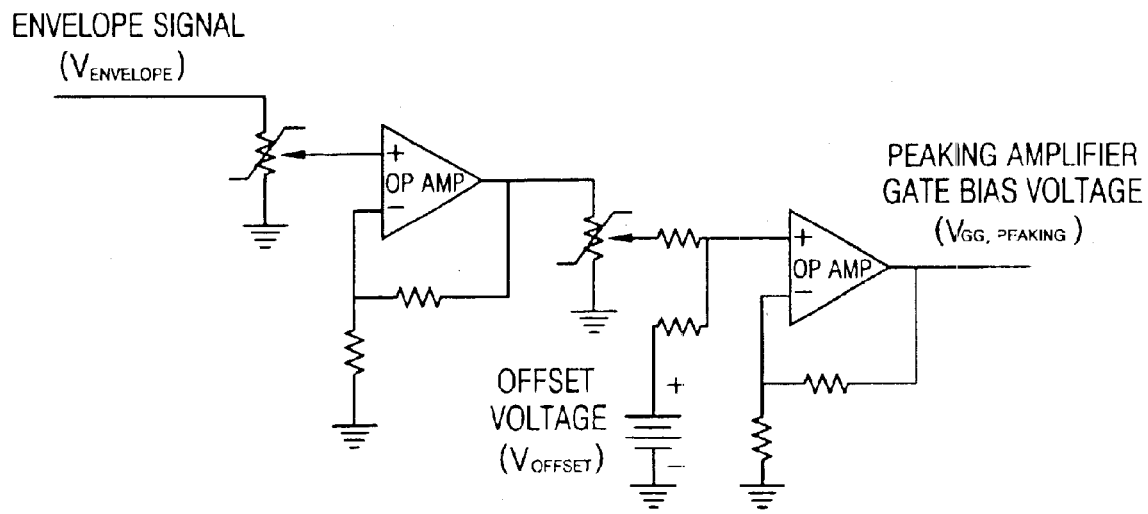
FIG. 6a is a diagram of the structure of an embodiment of an envelope shaping circuit of the envelope tracking apparatus of FIG. 5.

FIG. 6a is a diagram of the structure of an embodiment of an envelope shaping circuit 220 of the envelope tracking apparatus 200 of FIG. 5. By appropriately attenuating and amplifying a low frequency envelope signal detected by the envelope detector 210, and subtracting an offset from the signal, the envelope shaping circuit 220 makes the changes in the output voltage according to the envelope voltage ($V_{ENV}$) as shown in FIG. 6b, and provides the voltage to the peak amplifier (PA) as the gate bias voltage ($V_{GG,\ Peaking}$).

Figure 6B:
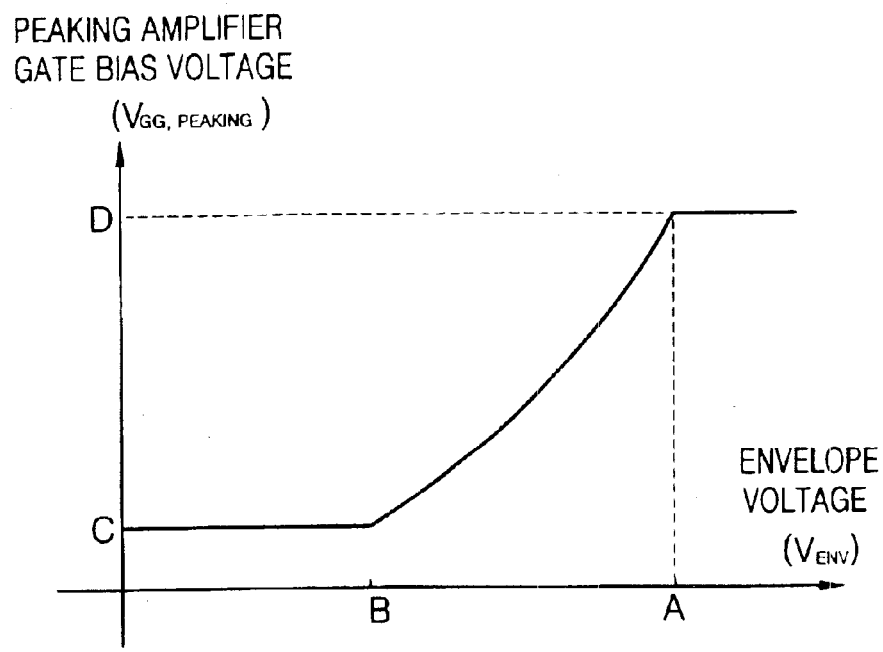

In FIG. 6b, location A indicates a location showing a maximum envelope voltage, and location B indicates a location where the peak amplifier (PA) of the Doherty amplifier 100 is turned on. Normally when N=2, location B indicates a location of a 6 dB backed-off power from a peak output power. In the region less than B; the gate bias voltage ($V_{GG,\ Peaking}$) of the peak amplifier (PA) is C, which should almost completely turn off the peak amplifier (PA). In location A, the gate bias voltage ($V_{GG,\ Peaking}$) of the peak amplifier (PA) is D and the bias of the peak amplifier (PA) is made to be the same as the gate bias voltage ($V_{GG,\ Carrier}$) of the carrier amplifier (CA). FIG. 6b is a graph related to the envelope shaping circuit 220, and by making a variety of changes to the Doherty amplifier of the present invention by applying this graph, the linearity and efficiency of the Doherty amplifier can be optimized.

Figure 7A:
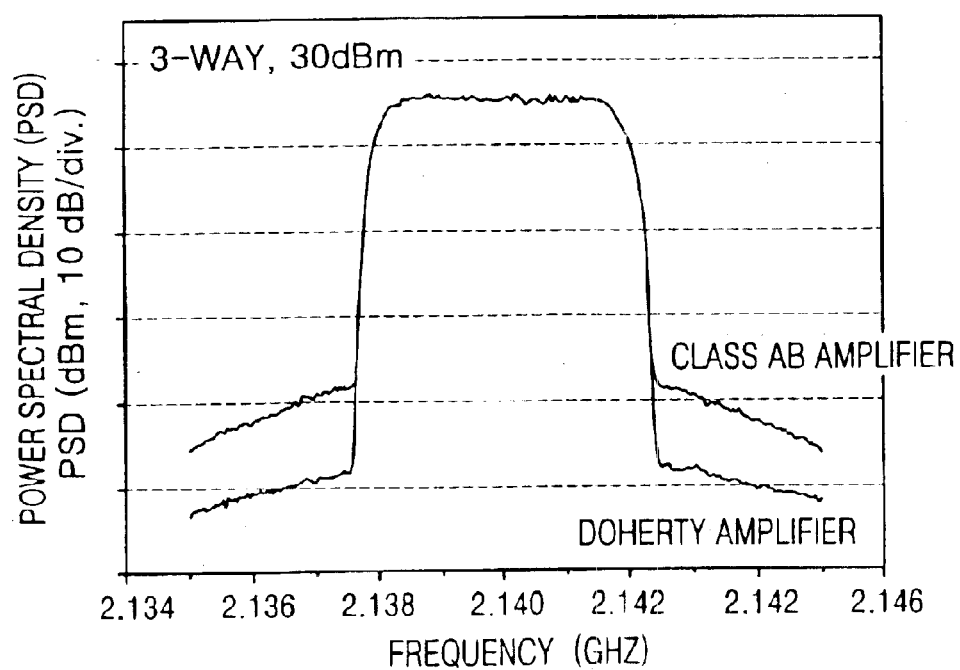
FIG. 7a is a graph showing spectrums resulting from linearization experiments when the number of ways is 3 (N=3) in FIG. 3.
Figure 7B:
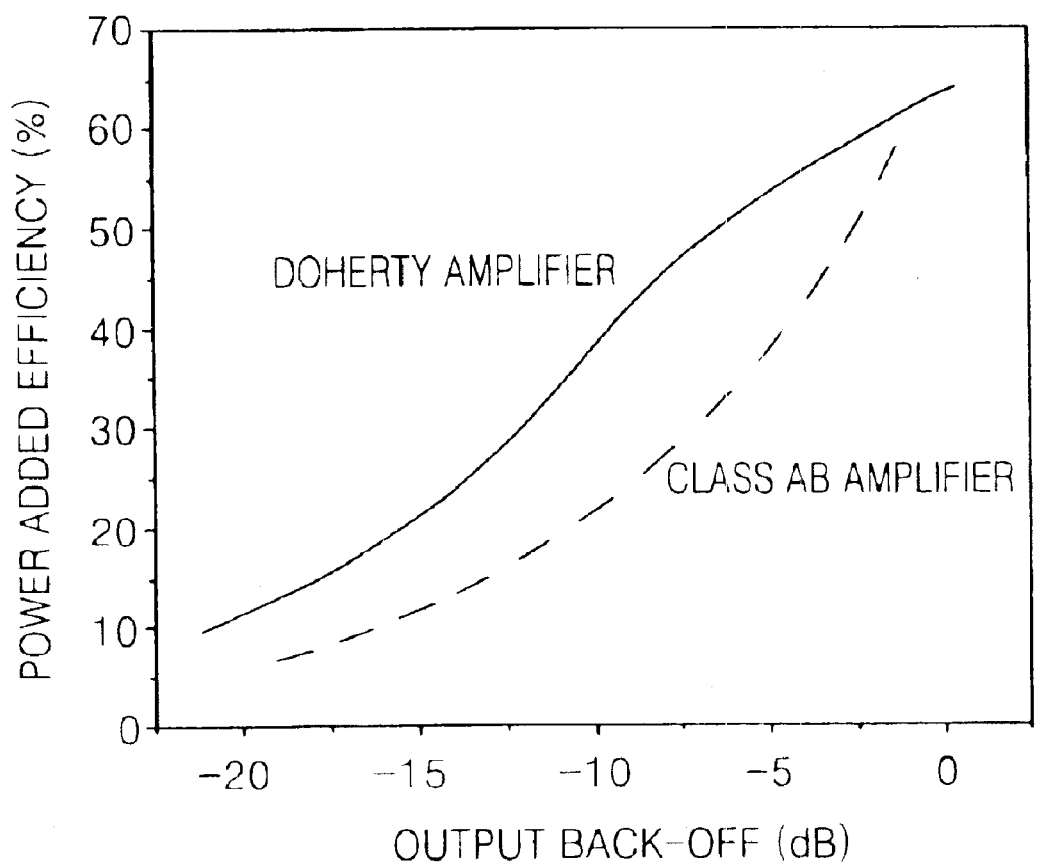
FIG. 7b is a graph comparing the efficiency which can be obtained by a Doherty amplifier having 2 ways (N=2) and employing the envelope tracking apparatus of FIG. 5, with the efficiency of an ordinary class AB amplifier.

FIG. 7a is a graph showing spectrums obtained by measuring in a 21.4 GHz band for the Doherty amplifier with N=3 as a preferred embodiment of the present invention. Referring to FIG. 7a, the graph shows that the Doherty amplifier of the present invention has very good linearity compared to the class AB amplifier that is the object of the comparison. FIG. 7b is a graph, showing the simulated result for a Doherty amplifier with N=2, employing the envelope tracking apparatus 200. This graph shows that the Doherty amplifier of the present invention has a much higher efficiency characteristic compared to the class AB amplifier according to output power back-off.

For reference, the vertical axis of FIG. 7a indicates, power spectral density (PSD) which shows power distribution for each unit frequency. When amplification is performed in an amplifier, energy is obtained from, a DC bias and is converted to radio frequency and then amplification is performed. The vertical axis of FIG. 7b indicates power added efficiency (PAE), which represents that how much of the power provided as a DC bias contributes to the amplification. In FIG. 7a, dBm that is the unit of PSD is a power unit that is obtained by converting Watts (more specifically, milli-Watts) using the log scale. It is well-known to those skilled in the art that the conversion formula is dBm=10 log(Watt/$10^{-3}$).

The Doherty amplifier according to the present invention as described above employs a way-extension method by which N ways (N≧2, N is a natural number) are established, and an envelope tracking method so that when the Doherty amplifier is applied to the power amplifier of a mobile communications base station or a handset, high efficiency and linearity can be simultaneously achieved and price competitiveness and reliability of an apparatus employing the Doherty amplifier can be improved.

Also, the microwave Doherty amplifier extracts a predetermined input envelope signal, appropriately shapes the signal, and provides the signal to the gate bias of a peak amplifier in order to obtain improved efficiency characteristics in all types of Doherty amplifiers.

Optimum embodiments have been explained above and are shown in the drawings. However, the present invention is not restricted to the above-described embodiments and many variations are possible within the spirit and scope of the present invention. The scope of the present invention is not determined by the above description but by the accompanying claims.

What is claimed is:

1. A Doherty amplifier comprising:

N ways, where N≧2 and N is a natural number;

a carrier amplifier which is placed on one of the N ways;

peak amplifiers which are placed on respective ways of the (N–1) ways excluding the way on which the carrier amplifier is placed;

a power distribution unit which distributes power to each of the N ways;

a first offset line located at the output of the carrier amplifier and having a characteristic impedance $R_{OC}$ a phase angle $\theta_C$;

a second offset line located at the output of the peak amplifiers and having a characteristic impedance $R_{OP}$ and a phase angle $\theta_P$;

a transmission line having a phase angle of $90°+\theta_C-\theta_P$ located at inputs of each of the peak amplifiers; and a quarter wave impedance transformer at which the N ways meet an having a characteristic impedance $R_T$, wherein $$R_T = \sqrt{\frac{R_{OP}R_{OC}}{R_{OP}}R_O}$$

and $R_O$ is output load resistance at the output of the quarter wave impedance transformer.

2. The Doherty amplifier of claim 1, wherein the carrier amplifier and peak amplifiers include transistors with matched identical characteristics.

3. A Doherty amplifier comprising:

N ways, where N≧2 and N is a natural number;

a carrier amplifier which is placed on one of the N ways;

peak amplifiers which are placed on respective ways of the (N–1) ways excluding the way on which the carrier amplifier is placed;

a power distribution unit which distributes power to each of the N ways;

a quarter wave impedance transformer at which the N ways meet; and an envelope tracking unit which turns off the peak amplifiers in a low power range and gradually turns on the peak amplifiers to a carrier amplifier bias in a high power range, to make gate bias of the carrier amplifier different from gate bias of the peak amplifiers.

4. The Doherty amplifier of claim 3, wherein the envelope tracking unit comprises:

an envelope detector; and an envelope shaping circuit which attenuates and/or amplifies an envelope signal detected by the envelope detector, removes an offset from the envelope signal detected by the envelope detector to produce a gate voltage applied to the peak amplifier.

5. The Doherty amplifier of claim 3, wherein the carrier amplifier and peak amplifiers include transistors with matched identical characteristics.

* * * * *